United States Patent [19]

Bross et al.

[11] Patent Number: 5,399,305
[45] Date of Patent: Mar. 21, 1995

[54] DYNAMIC GATING OF POLYMERS FOR ISOTROPIC PROPERTIES

[75] Inventors: Arthur Bross; Thomas Walsh, both of Poughkeepsie, N.Y.

[73] Assignee: International Business Machines Corporation, Armonk, N.Y.

[21] Appl. No.: 73,874

[22] Filed: Jun. 9, 1993

Related U.S. Application Data

[62] Division of Ser. No. 806,499, Dec. 13, 1991, Pat. No. 5,244,378.

[51] Int. Cl.⁶ .............................................. B29C 45/17
[52] U.S. Cl. ..................... 264/69; 264/328.1; 264/328.12
[58] Field of Search .................... 264/69–72, 264/328.1, 328.7, 328.8, 328.11, 328.12; 425/542, 574, 558, 561, 566, 567, 570, 571, 573

[56] References Cited

U.S. PATENT DOCUMENTS

| | | | |
|---|---|---|---|
| 4,288,398 | 9/1981 | Lemelson | 264/23 |
| 4,314,963 | 2/1982 | Boden et al. | 264/328.6 |
| 4,925,161 | 5/1990 | Allan et al. | 264/69 |
| 5,045,268 | 9/1991 | Sorensen | 264/328.8 |
| 5,244,378 | 9/1993 | Bross et al. | 264/69 |

FOREIGN PATENT DOCUMENTS

| | | | |
|---|---|---|---|
| 3516666 | 11/1986 | Germany | 264/69 |
| 62-130816 | 6/1987 | Japan | 264/69 |
| 2008023 | 5/1979 | United Kingdom | 264/69 |

*Primary Examiner*—Jill L. Heitbrink
*Attorney, Agent, or Firm*—Whitham, Curtis, Whitham & McGinn

[57] ABSTRACT

A polymeric article having isotropic properties is fabricated from anisotropic materials by orienting the polymer, as well as any fillers, in different directions at different planes through the polymeric article. In a first embodiment, molten polymer is passed between movable gate members (32 and 34) into cavity (30) of mold (28). The movable gate members (32 and 34) impart a strain on the molten polymer by moving in opposite directions (33 and 35) while the molten polymer is dispensed into the cavity (30). Reciprocating the movable gate members (32 and 34) yields a herringbone pattern. Having at least one movable gate member (38) have comb-like projections (40) can assure the strain is imparted deeper into the thickness of the polymeric article. In a second embodiment, molten polymer is passed through movable gates (96 and 100) on perpendicular sides of a mold cavity (94 and 98) where one movable gate (96) is located towards the top of the mold (84) and the other movable gate (100) is located towards the bottom of the mold (84). The gates (94 and 98) are simultaneously driven in directions (68 and 70) along their respective cavity sides while injecting polymer into the cavity. The finished article has a top layer (56) has polymer oriented (58) in a first direction and a bottom layer (52) with polymer oriented (54) in a perpendicular direction. Polymer is randomly oriented (62) between the top and bottom layer (56 and 52).

7 Claims, 7 Drawing Sheets

DYNAMIC GATING OF POLYMERS FOR ISOTROPIC PROPERTIES

This application is a division of application Ser. No. 07/806,499, filed on Dec. 13, 1991, now U.S. Pat. No. 5,244,378.

BACKGROUND OF THE INVENTION

1. Field of the Invention

The present invention generally relates to methods and apparatus for producing molded parts having isotropic or nearly isotropic properties when the starting material has anisotropic properties and, more particularly, to injection molding processes and apparatus for forming polymeric items and/or products having superior mechanical, electrical, thermal, and chemical properties. Such items include but are not limited to substrates, printed circuit boards, printed wiring boards, connectors, interposers, and the like.

2. Description of the Prior Art

The problems associated with anisotropic materials are well known by manufacturers and users of polymeric materials. Attempts to overcome anisotrophy include filling and/or loading the materials with various fillers thereby restricting shrinkage or directional flow of the polymer as it is filling the mold cavity or being extruded. Successful use of these techniques has been limited and, in some cases, the techniques have actually aggravated the problems associated with anisotrophy.

Anisotrophy can and does affect numerous properties of a material including mechanical, thermal, electrical, and chemical as well as manufacturing or fabricating the material into a useful product. In the manufacture of an item such as a substrate used to attach semiconductors, circuits, via-connectors, and the like, it is desirable to have properties the same in all directions if possible; that is, the substrate should be isotropic in nature. Many isotropic materials, however, possess poor physical properties that do not meet electrical substrate/board requirements.

Important properties to insure success of a molded polymeric item such as a substrate for electrical components include (1) matched (within allowable tolerances) coefficient of linear expansion to the materials and components being used, (2) high thermal conductivities, (3) high continuous use temperature, (4) non-flammable, (5) high chemical resistance, (6) low water absorption, (7) non-corrosive, and (8) processability. Additionally, it is preferable that the materials be low cost and easy to manufacture into required geometries, be capable of surface mounting and vapor phase soldering technologies, be circuitized with various metals and by various techniques, and have long term mechanical stability.

A typical material having desirable properties for electrical substrates is a group of materials called liquid crystal polymers. However, in current injection molding processes, parts produced using these materials exhibit a uniaxial, anisotrophic orientation. Such parts exhibit properties which are highly dependent on orientation.

Recently, molding techniques have been developed which allow the production of parts having defined layers of directionally oriented materials. In particular, U.S. Pat. No. 4,994,220 to Gutjahr et al. discloses a process for injection molding parts from plasticized liquid crystal polymer materials wherein a molten flow of the materials are injected into a mold cavity through at least two different gates positioned at different locations around the cavity at different heights. Gutjahr et al. specifically points out that there are advantages in having fibers in adjacent layers oriented 90° apart. That is, when layers of liquid crystal polymers are staggered at 90°, the end product is more isotropic since there will be criss-crossing lines of anisotrophy. The method of Gutjahr et al. does not employ movable gates to produce the oppositely oriented layers in the liquid crystal polymer parts and does not consider the effects of filling pressures and drops on the shinkage in multiple dierections. Other examples of newer molding techniques are found in U.S. Pat. No. 4,925,161 to Allan et al. which shows a process for molding directionally-orientable materials using shear force and in Kirkland et al., "New molding methods increase design freedom", *Plastics World*, pp. 37–42 (February, 1991) which discusses the "live-feed injection molding" described in U.S. Pat. No. 4,925,161 to Allan et al. as well as a push-pull injection molding technique.

SUMMARY OF THE INVENTION

It is an object of this invention to provide methods and apparatus for molding parts with nearly isotropic properties from materials that are normally anisotropic which employ at least one moveable gate associated with the mold.

It is another object of this invention to provide a multi-axially oriented thermotropic, liquid crystalline polymeric product exhibiting isotropic properies.

According to the invention, a thermally processable polymer material, such as a thermotropic liquid crystalline polymer, is molded in a manner which orients the polymer material (e.g., polymer fibrils or the like) or fibrous or filler materials blended with the polymer material along multiple axes. In a first embodiment, the polymer material is flowed through a dynamic gate having spaced apart, opposed surfaces which translate or move in different directions. As the melted polymer material traverses the moving, spaced apart, opposed surfaces, an angular shear is imparted to the polymeric material. Velocity of material flow, speed of gate surface movement in opposite directions, and rate of part solidification imparts an angular orientation to the opposite surfaces of the part being molded. Optimizing this combination of material flow, gate movement, and part solidification rate provides cross ply or biaxial properties to opposite planes of the part with a transition between surfaces. Typically, a 45° cross orientation, top and bottom, to the flow of material provides optimum properties; however, any tailoring desired can be made by varying the dynamics of the process. Enhancements of this first embodiment include driving the gate surfaces in a reciprocating manner (not necessarily cyclic), whereby the polymer orientation imparted by the moving gate surfaces resembles a herringbone pattern, and making at least one of the gate surfaces have a comb-like structure, whereby the shearing action caused by the oppositely moving gate surfaces can be extended further into the thickness of the part. In a second embodiment, the polymer material is flowed through at least two dynamic gates which are oriented 90° apart around the perimeter of the mold cavity and at different heights. The melted polymer material is simultaneously deposited through both gates as both gates are moved across their respective sides of the mold cavity. The two dynamic gates may either be driven across their respective cavity sides by an external drive or by the melt flow itself.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

In isotropic materials, properties at any given point are the same independent of direction of measurement; whereas, anisotropic materials depend on the direction in which they are measured and on the symmetry existing in the material. Anisotrophy may be considered analogous to the properties associated with and across the grain of a piece of wood. It is well known that by taking laminar layers of wood, which is highly anisotropic, and laminating at cross or other directions, a product such as plywood with resulting multi-directional properties can be obtained. Likewise, by taking an anisotropic polymer and molding it with laminar multi-directional and/or merged layers, an isotropic material can be approximated. This invention is directed to producing structural multi-axial orientation in a molded part by either introducing a dynamic counter surface gate shearing of an injected polymer or composite as it flows through oppositely moving gate surfaces or by creating alternating layers of oriented polymer using two or more dynamic gates positioned at different locations around the perimeter of a mold cavity. The invention may be used to mold polymers which are inherently anisotropic, such as liquid crystal polymers, or composite materials having fibers or fillers.

Figure 1:
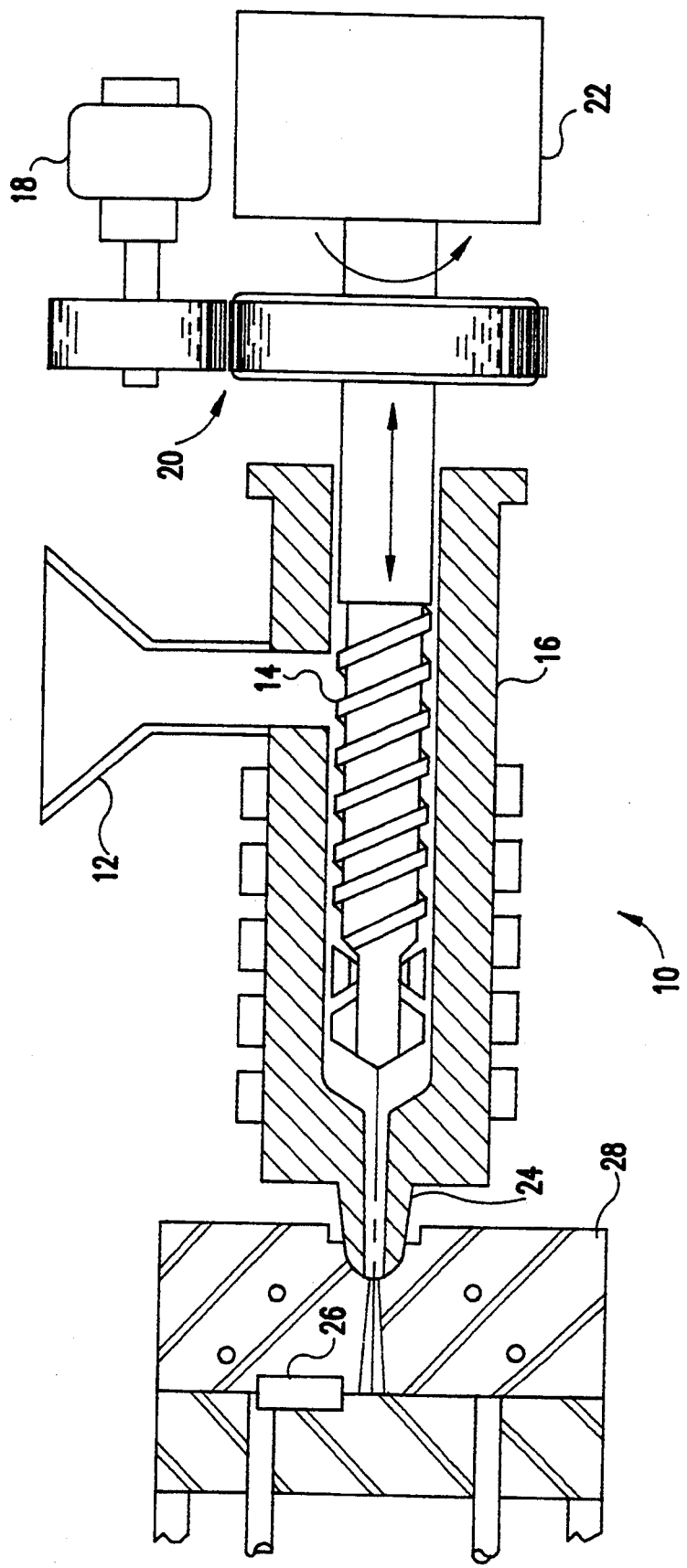
FIG. 1 is a block diagram, partially in cross-section, showing a typical injection molding apparatus.

Referring now to the drawings, and more particularly to FIG. 1, there is shown a typical injection molding apparatus 10 wherein polymeric material, such as liquid crystal polymers, in granular form is fed into a hopper 12. The polymeric material is fed by a feed screw 14 through a heating cylinder 16 to melt the polymer. The feed screw 14 is rotated by a screw motor 18 via a coupling 20. The feed screw 14 also functions as a hydraulic ram which is reciprocally moved back and forth by hydraulic cylinder 22 when a predetermined amount of material, as detected by the pressure within the cylinder 16, accumulates in front of the screw 14. The melted polymer is then forced through the nozzle 24 and into the mold cavity 26 where it is held, under pressure, until it solidifies. The mold is then opened, the part removed and the process repeated. The mold cavity 26 could be duplicated at several locations in the mold 28 such that multiple parts could be produced simultaneously.

The molding system of FIG. 1, or many other molding systems, could be used within the practice of the present invention which is primarily concerned with the point of polymer flow entry into the mold cavity 26.

Figure 2:
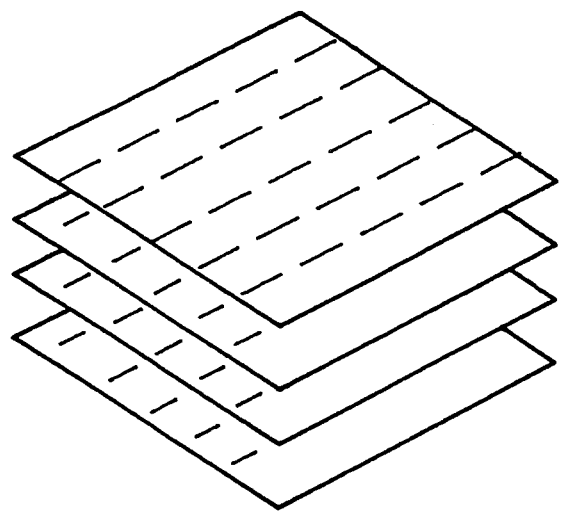
FIG. 2 is an isometric exploded view of sliced planes of a normal molding with orientation in the flow direction.

FIG. 2 shows a series of planes through a molded part produced by a conventional static gate injection molding apparatus. The orientation in each is in the direction of flow through the static gate, thereby resulting in a highly anisotropic structure.

Figure 3:
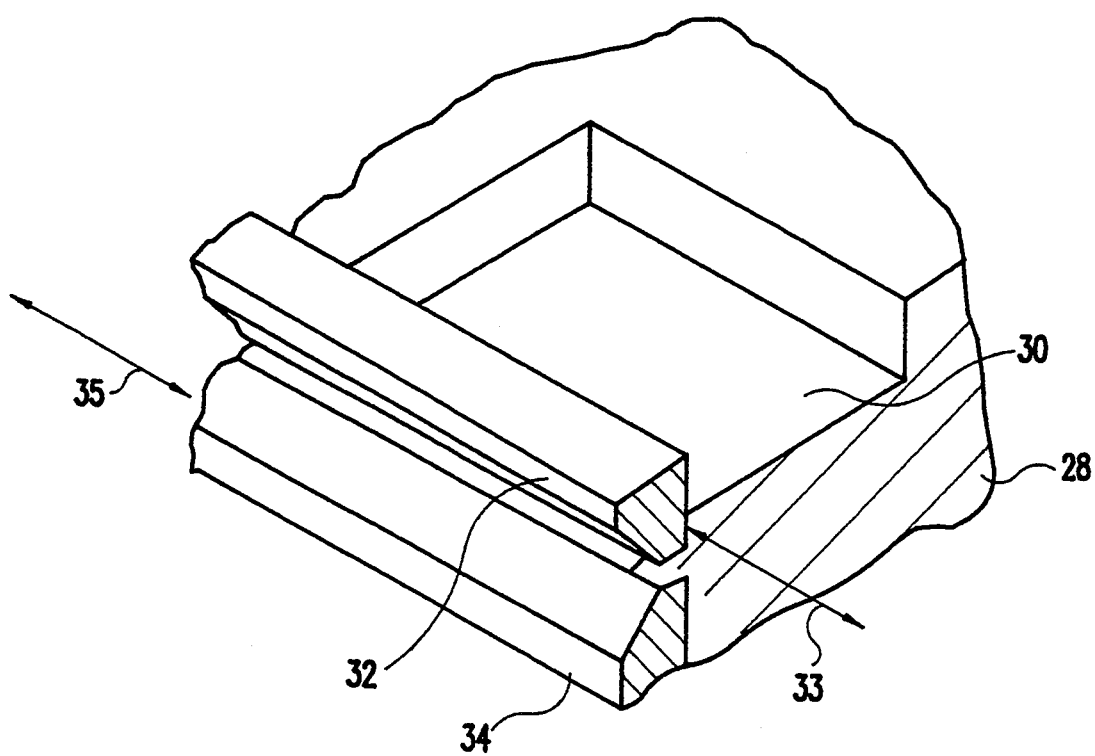
FIG. 3 is an isometric view, partly in cross-section, of a substrate cavity in a mold with the top removed showing the top and bottom surface members of a dynamic gate according to a first embodiment of the present invention.
Figure 4:
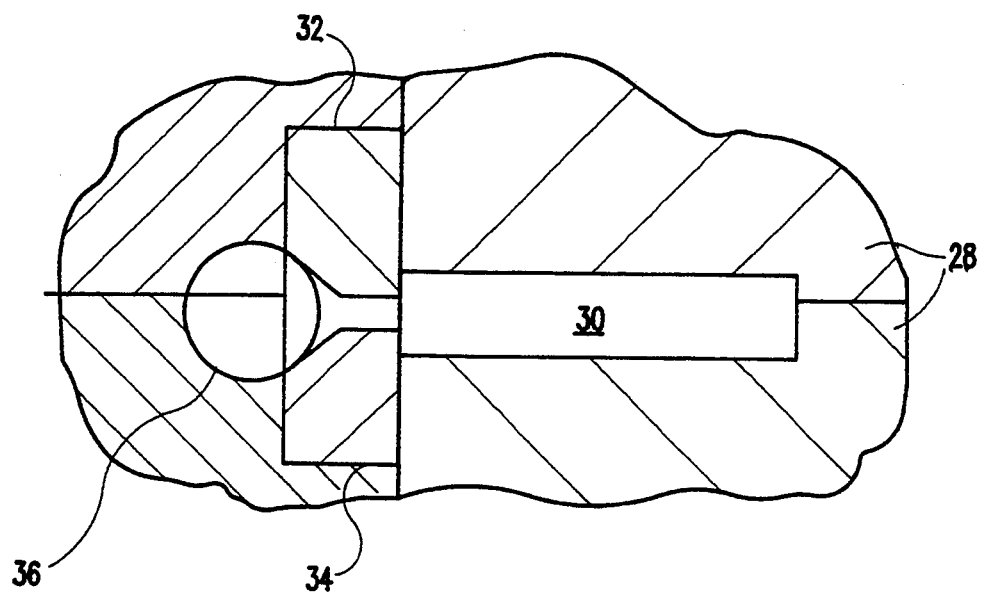
FIG. 4 is a cross-sectional side view of the substrate cavity as well as the top and bottom surface members of the dynamic gate of FIG. 3.

FIGS. 3 and 4 show a mold with a dynamic gate according to one embodiment of the present invention. The mold 28 has a cavity 30 therein. The cavity 30 is simply a defined volume, much like cavity 26 in FIG. 1, which is designed to hold melted polymer until it solidifies, afterwhich the molded part is removed from the cavity 30 by separating the mold 28. The dynamic gate is comprised of two spaced apart, movable gate members 32 and 34 which are positioned to one side of the cavity 30. Melted polymer is flowed through feed line 36 past the movable gate members 32 and 34 and into the cavity 30. The movable gate members 32 and 34 allow for creating nearly isotropic parts from anisotropic materials such as liquid crystal polymers. The movable gate members are driven externally by a rack, solenoid, piston or the like, in the directions indicated by double headed arrows 33 and 35, and are timed with the flow of the polymer or composite. By driving the gate members 32 and 34 in opposite directions, a shear force is introduced to the top and bottom surfaces of the polymer, causing orientation to the melt flow immediately prior to its introduction into the cavity 30.

Figure 6:
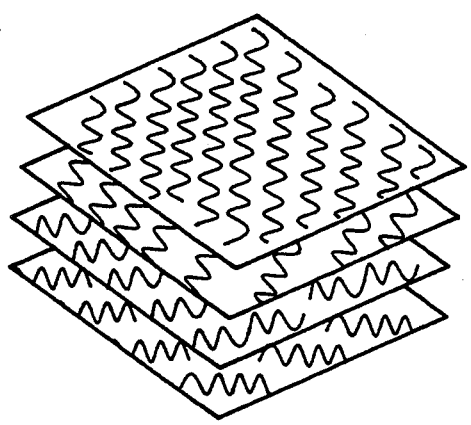
FIG. 6 is an isometric exploded view of sliced planes of a molding with multi-axis orientation, and herringbone configurations, according to another aspect of the invention.
Figure 5:
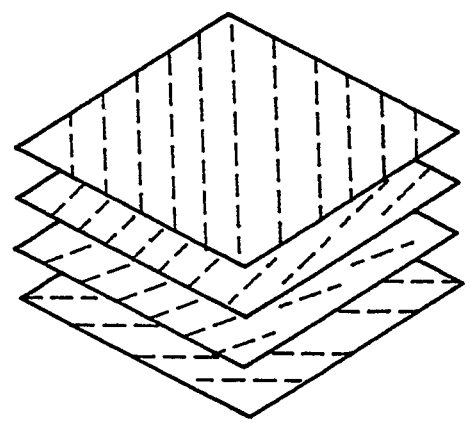
FIG. 5 is an isometric exploded view of sliced planes of a molding with multi-axis orientation produced according to one aspect of the invention.

With reference to FIGS. 5 and 6, depending on the manner by which the gate members 32 and 34 are driven, the resulting parts can have somewhat different configurations; however, the overall concept of producing a multi-axial part is the same. In FIG. 5, the resulting product is produced by driving gate members 32 and 34, each only one way in an opposite direction 33 and 35 (i.e., drive gate member 32 one way and drive gate member 34 the other way, and do not switch directions of the gate members 32 and 34 while forming the part), so that it has a plurality of planes therethrough which preferably are oriented from +45° in the top plane to −45° in the bottom plane. Hence, the orientations in the top and bottom planes are oriented perpendicular to one another which will guarantee the molded product of having isotropic-like properties. Some intermediate planes through the product will have an orientation above or below 0° which depends on the depth to which the shearing influence of gate member 32 or 34 is exerted. Intermediate planes through the product in the central region where no shearing influence is exerted or where the shearing influence of gate members 32 and 34 is in balance will have an orientation at 0° like that of the planes shown in FIG. 2. Hence, the planes through the product will have multiple axes of orientation throughout the product from top to bottom. In FIG. 6, the resulting product is produced by driving gate members 32 and 34 in opposite directions 33 and 35 in a reciprocating fashion (i.e., drive gate member 32 in one direction along 33 for a short time then in the opposite direction along 33 for a short time, likewise for gate member 34) so that a wave pattern configuration, such as a herringbone pattern, of the polymer, fibrils or matrix materials, results in the planes throughout the product from top to bottom. As described in conjunction with FIG. 5, the degree of shearing influence of gate members 32 and 34 on the polymeric material will vary depending on the proximity to either surface; therefore, the product will have multiple axes of orientation. The herringbone pattern configuration of FIG. 6 provides additional isotropic-like properties since the planes through the product will themselves have opposite lines of anisotrophy.

The end product shown in FIGS. 5 and 6 is a function of the velocity of polymer flow through feed line 36, the speed at which the gate members 32 and 34 translate (move or reciprocate), and the rate at which the product solidifies in the mold. All of these parameters are adjustable by manufacturer for purposes of optimizing the parts produced. If the flow across the cavity 30 is unduly influenced by the opposing horizontal surfaces of the interior of the cavity, the relationships between flow rate, gate movement and solidification rate can be adjusted to compensate. Alternatively, a volume controlled short shot can be injected followed by a compression of the cavity to the final dimensions of the part.

Figure 7:
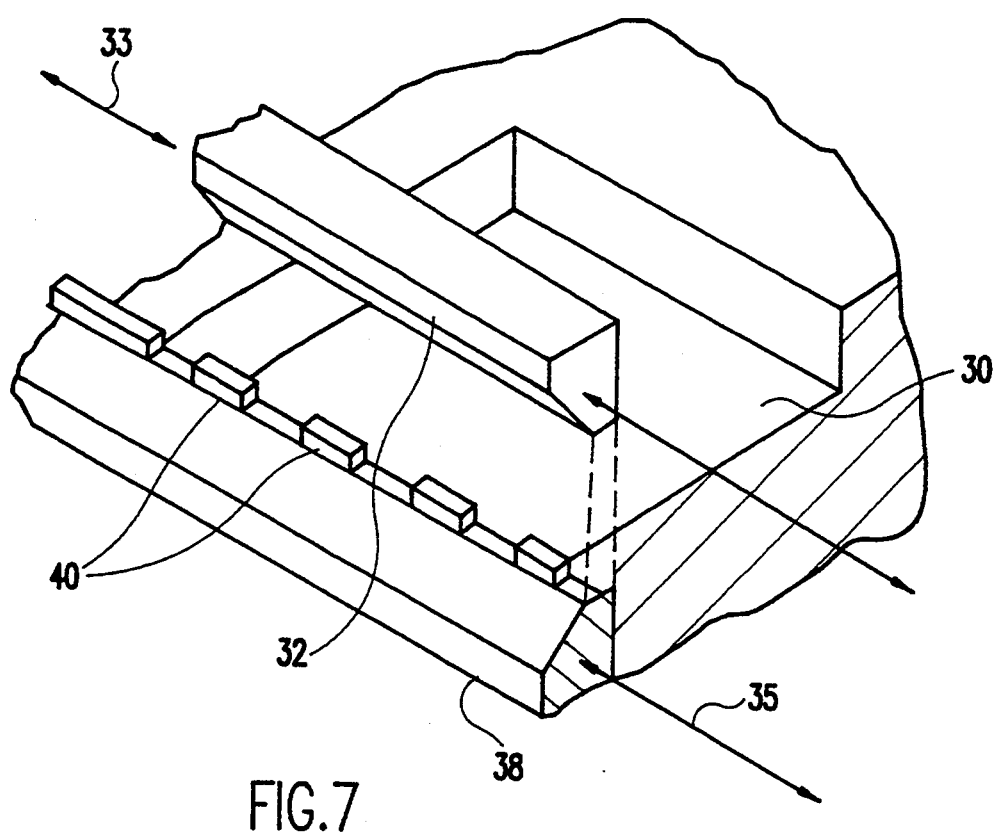
FIG. 7 is an isometric view, partly in cross-section, of a substrate cavity in a mold with the top removed showing the top and bottom surface members of a dynamic gate according to an enhancement of the invention shown in FIG. 3.

FIG. 7 shows an alternative mold configuration to that shown in FIG. 3 wherein lower gate member 34 has been replaced with a gate member 38 having a comb-like configuration. It is also possible to replace gate member 32 with a comb-like structure. The operation of gate members 32 and 38 is similar to that described above in conjunction with FIGS. 3–6. The principal advantage of using a gate member 38 with comb projections 40 is that the shearing forces can be exerted deeper into the part by the projections 40. Therefore, the end product will have greater multi-axial orientations in its mid-region and less transitional regions than could be achieved with the smooth gate members 32 and 34.

The sequence of events in the molding process are to close the mold 28, flow the polymer or composite material to and past the oppositely moving gate members 32, 34 and/or 38, solidify the molded part, eject the part, and repeat the cycle for the next part. Although only one cavity 30 is shown in the illustrative preferred embodiment, it will be understood by those skilled in the art that multiple cavities may be implemented in the mold 28, thereby increasing production of parts. While liquid crystal polymers are preferred for a specific application of the invention, it will be apparent that other materials and composites may be used as may be appropriate to the application.

Figure 8:
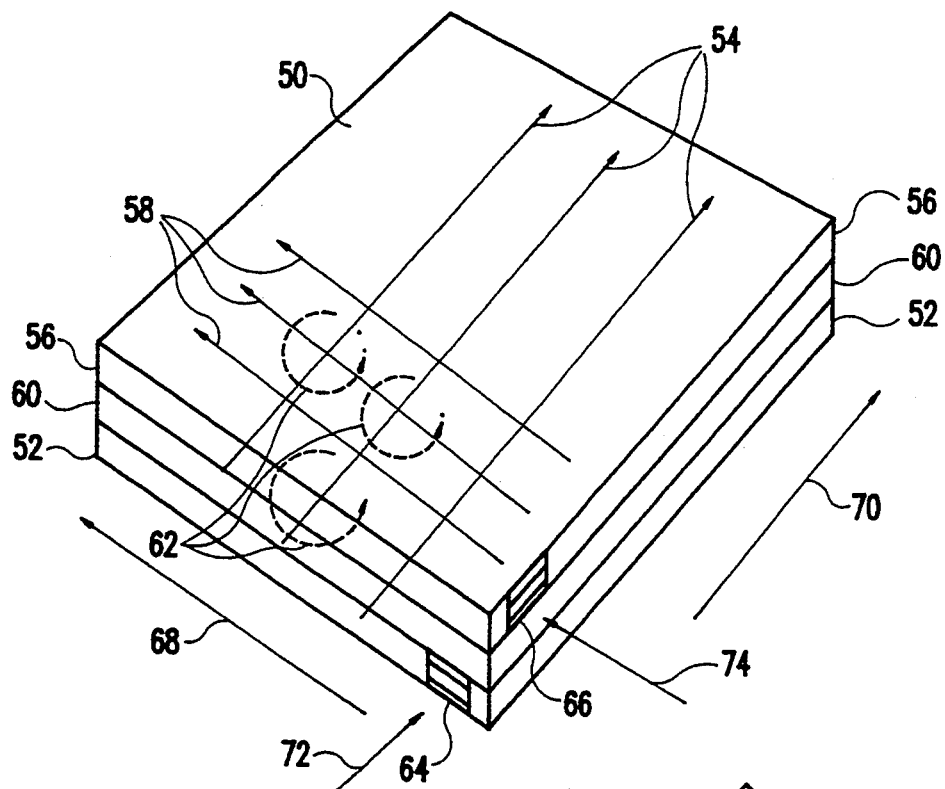
FIG. 8 is an isometric view of a part produced according to a second embodiment of the invention illustrating the directions of polymer orientation at different levels of the part.

FIG. 8 illustrates a molded part 50 produced according to a second embodiment of the invention which can have a lower layer 52 having polymer material oriented according to arrows 54, an upper layer 56 having polymer material oriented according to arrows 58, and a middle layer 60 having polymeric material randomnly ordered as indicated by arrows 62. The molded part 50 is made by simultaneously injecting melted polymer through gate areas which are represented by blocks 64 and 66. The gate areas 64 and 66 are obviously not associated with molded part 50; however, they are indicated in FIG. 8 to illustrate how the molded part 50 filling is initiated. The mold itself is discussed below in conjunction with FIGS. 10 and 11. Gate area 64 is located in the mold cavity at a point positioned to form the lower layer 52 of the molded part 50 and traverses a path 68 along one side wall of the mold cavity. Gate area 66 is located in the mold cavity at a point positioned to form the upper layer 56 of the molded part 50 and traverses a path 70 along another side wall of the mold cavity. Melted polymer is injected through gate area 64 in direction 72 and gate area 66 in direction 74 as the gate areas move along paths 68 and 70, respectively. Injecting the melted polymer through narrow gate areas 64 and 66 creates uniaxial orientation of the polymer delivered and that uniaxial orientation is solidified into the molded part 50 such that it has lower and upper layers 52 and 56, respectively, that have opposite axes of orientation (e.g., 54 and 58, respectively). Hence, the molded part has isotropic-like properties even though it may be molded from anisotropic materials. In the intermediate region between the gate areas 64 and 66, the direction of polymer flow 72 and 74 does not contribute greatly to the ultimate orientation of the polymer fibrils, filler or the like; therefore, the middle layer 60 has portions which have random orientation 62. The thickness of the middle layer 60 can vary with the positioning of gate areas 64 and 66.

As described above in conjunction with FIGS. 3–7, the molded part 50 can be made using anisotropic materials, such as liquid crystal polymers, polymers with associated filler or fiber materials, or the like. The sequence of events is to close the mold, fill the mold with melted polymer using dynamically moving gate areas 64 and 66, solidify the part, eject the part, and repeat.

Figure 9:
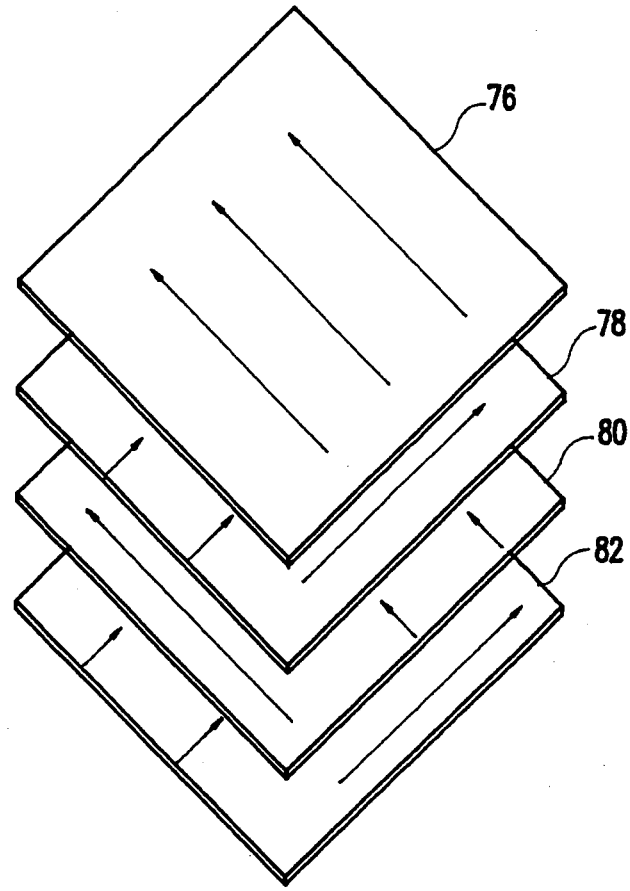
FIG. 9 is an isometric exploded view of sliced planes of a molding produced in a manner similar to the second embodiment of FIG. 8.

FIG. 9 illustrates that a molded part which embodies the principles described in conjunction with FIG. 8 can be produced using multiple gate areas. In FIG. 9, layers 76, 78, 80, and 82 of the molded part have a staggered orientation with respect to one another. This is achieved by providing the mold with two gate areas similar to 64 and two gate areas similar to 66, both of which are discussed in conjunction with FIG. 8, on different sides of a mold cavity. The optimum number of repetitions of the staggered pattern is determined by the manufacturer. A particular application of a multi-layered polymer part would be for multilayered circuits.

Figure 10:
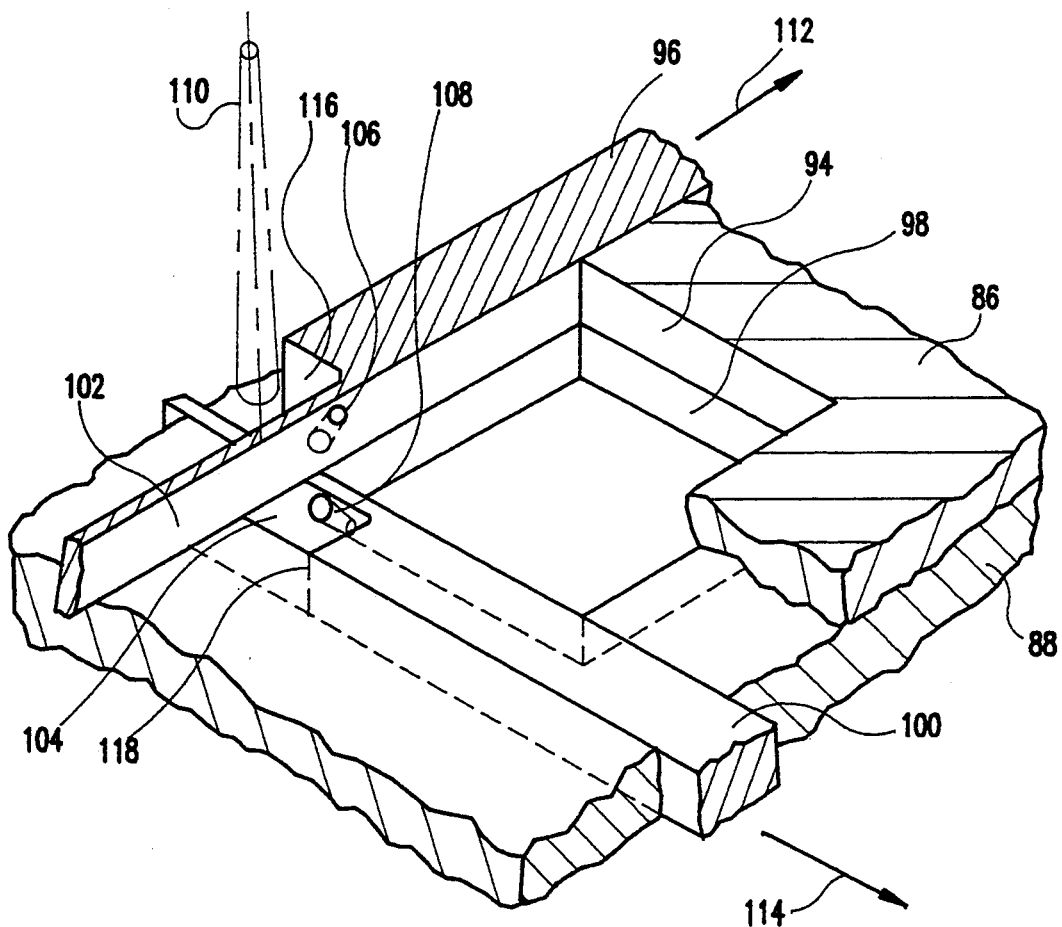
FIG. 10 is an isometric view, partly in cross-section, of a substrate cavity in a mold with the top removed showing two dynamic gates located on different sides of the mold cavity and at different heights relative to the mold cavity.
Figure 11:
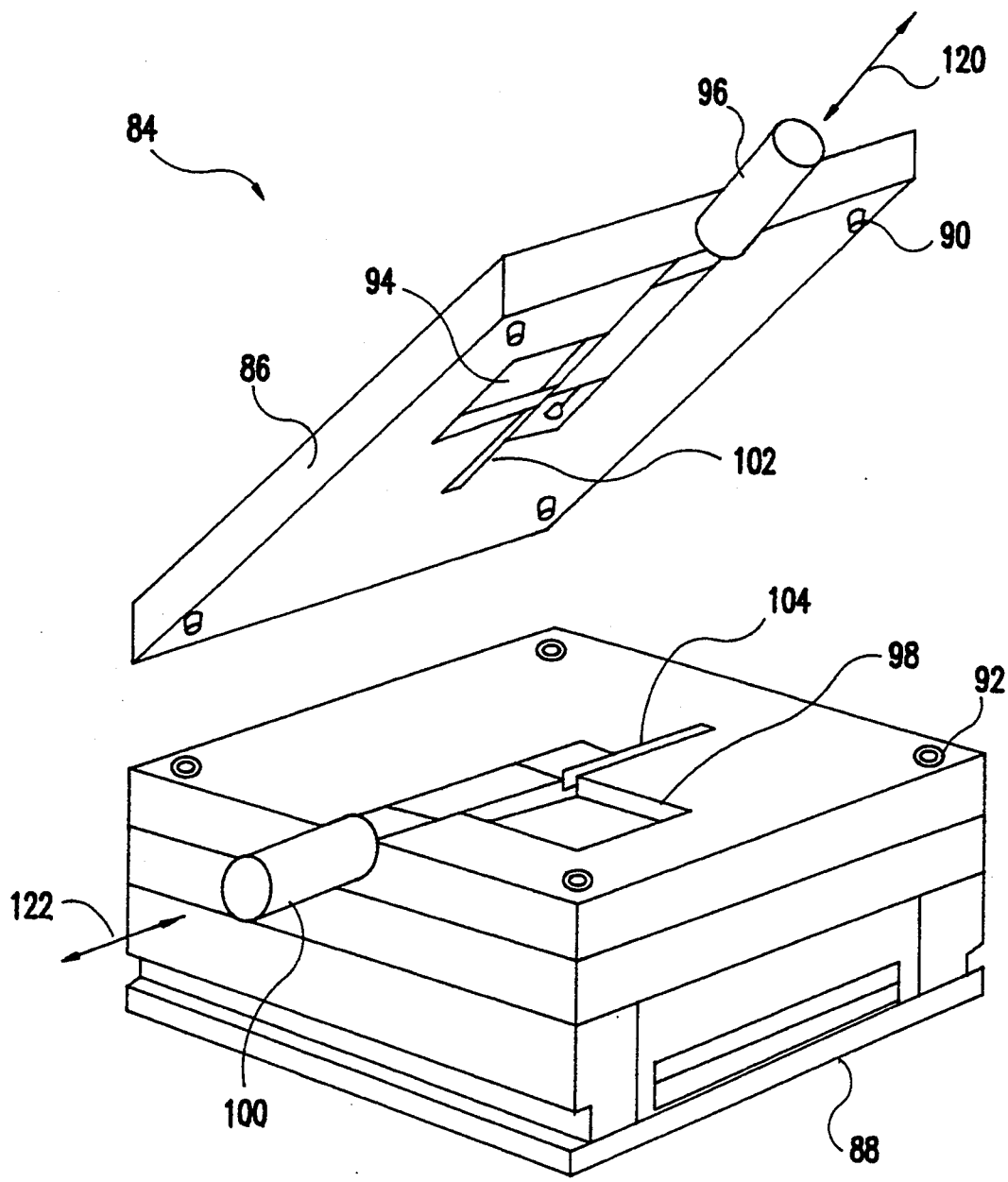
FIG. 11 is an isometric view of a mold according to the second embodiment of the invention.

FIGS. 10 and 11 show a mold 84 which may be used to make the molded part 50 of FIG. 8. The mold 84 has top and bottom halves 86 and 88, respectively, which are aligned together by pins 90 and bushings 92. The top half 86 has an upper cavity 94 and dynamic gate 96. The bottom half 88 has a lower cavity 98 and dynamic gate 100. Dynamic gates 96 and 100 each have blade runner areas 102 and 104, respectively. Each of which have tunnels 106 and 108 therethrough. Melted polymer 110 fills the upper and lower cavities 94 and 98 by directing polymer through the tunnels 106 and 108 as the dynamic gates 96 and 100 move in directions 112 and/or 114. With reference back to FIG. 8, tunnels 106 and 108 correspond to gate areas 66 and 64, respectively. FIG. 10 illustrates that the dynamic gates 96 and 100 can be passively driven by the melted polymer 110 impinging on drive surfaces 116 and 118, respectively, while the polymer 110 is extruded through tunnels 106 and 108. Alternatively, FIG. 11 illustrates that the dynamic gates 96 and 100 can be driven by external sources 120 and 122, respectively, such as by a rack, piston, or some other mechanism.

A particular advantage of the mold illustrated in FIGS. 10 and 11 and its operation described in conjunction with FIG. 8 over the mold described in U.S. Pat. No. 4,994,220 to Gutjahr et al. is that by using dynamic gates 96 and 100, the same kinds of filling pressures and drops will be encountered as melted polymer 110 fills the cavities 94 and 98. Therefore, the molded part 50 will have equal shrinkage factors in different directions 54 and 58. Gutjahr et al. uses repeating cyclic feeding of the polymer, while the present embodiment of the invention uses ongoing simultaneous feeding to feed the cavity.

While the invention has been described in terms of its preferred embodiments, those skilled in the art will recognize that the invention can be practiced with considerable modification within the spirit and scope of the appended claims.

Having thus described our invention, what we claim as new and desire to secure by Letters Patent is as follows:

1. A process for forming a polymeric article comprising the steps of:

supplying a melted polymer material to a mold having a restricted gate area comprised of at least two spaced apart opposing gate members which provides access to a cavity in said mold; and subjecting said melted polymer material to a shear force by moving each of said two opposing gate members in a direction perpendicular to a flow path of said melted polymer material from a supply into said cavity in said mold.

2. A process as recited in claim 1 wherein both of said two opposing gate members move in opposite directions during said subjecting step.

3. A process as recited in claim 2 further comprising the step of reciprocating a direction of movement for both of said two opposing gate members during said subjecting step.

4. A process for forming a polymeric article; comprising the steps of:

supplying a melted polymer material to a mold having at least two movable gates positioned on different sides of a cavity in said mold and at different height regions with respect to a height dimension across said cavity in said mold;

passing said melted polymer material through apertures in each of said two movable gates into said cavity of said mold; and moving each of said two movable gates along its respective side of said cavity during said passing step.

5. A process as recited in claim 4 further comprising the step of positioning said two movable gate members to move on paths perpendicular to each other.

6. A process as recited in claim 4 wherein said step of moving is performed passively under an influence of a flow of said melted polymer material, 7. An process as recited in claim 4 wherein said step of moving is performed actively by a means for simultaneously moving each of said two movable gates.

* * * * *